United States Patent [19]

Goto et al.

[11] Patent Number: 4,594,606
[45] Date of Patent: Jun. 10, 1986

[54] SEMICONDUCTOR DEVICE HAVING MULTILAYER WIRING STRUCTURE

[75] Inventors: Hideto Goto; Haruo Amano, both of Tokyo, Japan

[73] Assignee: NEC Corporation, Tokyo, Japan

[21] Appl. No.: 502,545

[22] Filed: Jun. 9, 1983

[30] Foreign Application Priority Data

Jun. 10, 1982 [JP] Japan ............................... 57-99720

[51] Int. Cl.⁴ ............................................ H01L 23/48
[52] U.S. Cl. ...................................... 357/68; 357/71; 357/65; 357/54; 29/591
[58] Field of Search ...................... 357/68, 71, 65, 59, 357/52, 54; 29/591

[56] References Cited

U.S. PATENT DOCUMENTS

| 3,801,880 | 4/1974 | Harada et al. | 357/68 |
| 3,839,111 | 10/1974 | Ham | 357/65 |
| 4,242,698 | 12/1981 | Ghate et al. | 357/71 |

FOREIGN PATENT DOCUMENTS

| 0011776 | 1/1977 | Japan | 357/59 |
| 0012587 | 1/1977 | Japan | 357/59 |
| 0140883 | 11/1979 | Japan | 357/68 |

OTHER PUBLICATIONS

RCA Technical Note, "Silicon Nitride Isolation of Phosphosilicate Glass Layer", TN #1234, Nov. 1979.
IBM Technical Disclosure Bulletin, vol. 16, #7, Dec. 1973, "Power Distribution for Large Scale Integrated Circuits" by Braen.
IBM Tech. Disc. Bull., vol. 18, #5, Oct. 1975 by Hayunga, p. 1448.
IBM Tech. Disc. Bull., vol. 19, #6, Nov. 1976 by Tsang, p. 2047.
IBM Tech. Disc. Bull. vol. 24, #3, Aug. 1981 by Rathore, p. 1739.
IBM Tech. Disc. Bull., vol. 22, #7, Dec. 1979 by Eames.

*Primary Examiner*—Andrew J. James
*Assistant Examiner*—Mark Prenty
*Attorney, Agent, or Firm*—Burns, Doane, Swecker and Mathis

[57] ABSTRACT

A semiconductor device having a multilayer wiring structure with improved interlayer connections comprises a semiconductor substrate with a first insulating layer provided on a major surface of the substrate; a first extended wiring layer of, for example, polycrystalline silicon, formed on the first insulating layer and preferably having an essentially rectangular cross-sectional shape; a second insulating layer provided on the first insulating layer and on the first wiring layer; a contact hole provided in the second insulating layer to expose a contact region of the first wiring layer and having a width greater than the width of the contact region; a third insulating layer formed in the contact hole in contact with the sidewalls of the contact region and having a thickness which decreases in height smoothly and gradually in a direction away from the respective contact region sidewalls; a second extended wiring layer of, for example, aluminum formed on the second insulating layer, in contact with the third insulating layer in the contact hole and connected electrically to the upper surface of the contact region of the first wiring layer.

14 Claims, 8 Drawing Figures

SEMICONDUCTOR DEVICE HAVING MULTILAYER WIRING STRUCTURE

BACKGROUND OF THE INVENTION

This invention relates to a semiconductor device with a multilayer wiring structure and a method of manufacturing the same and, more particularly, to an interlayer connection in the multilayer wiring structure.

The multilayer wiring structure of a conventional semiconductor device is comprised of a first wiring layer provided on a first insulating layer on a major surface of a semiconductor substrate, a second insulating layer provided over the first wiring layer and the first insulating layer, a contact hole provided in the second insulating layer such that it is positioned inside the first wiring layer, and a second wiring layer extending over the second insulating layer and connected to the first wiring layer through the contact hole. However, in such structure, the contact hole must be positioned inside the first wiring layer. As a consequence, the contact region of the first wiring layer must be made about 1.5 $\mu$m larger on each side, a total of about 3 $\mu$m larger on both sides, than the contact hole to accommodate the mutual positioning tolerances, the etching tolerance for the contact hole, like, and thus the wiring density of the first wiring layer is considerably reduced.

To overcome this defect in the prior art, a so-called "outward-extracted contact structure" has been proposed. The contact hole in this structure has a broader width than that of the first wiring larger so that side walls of the first wiring layer as well as its upper surface are exposed by the contact hole, and the second wiring layer is contacted to both the upper surface and side walls of the first wiring layer at the contact hole. Such a structure can improve the wiring density of the first wiring layer, because the contact hole does not need to be positioned inside the first wiring layer. However, this contact structure has the defect that a discontinuity of the second wiring layer is caused by the abrupt step at the end of the first wiring layer. Especially when the first wiring layer is made of polycrystalline silicon and the second wiring layer is made of aluminum, discontinuities occur frequently in various contact portions of the "outward-extracted contact structure".

SUMMARY OF THE INVENTION

Accordingly, an object of the present invention is to provide a reliable semiconductor device which has a high density of wiring layers and which does not cause discontinuities in the upper wiring layer at the contact portion.

An another object of the present invention is to provide an effective process of manufacturing this device.

According to one feature of the present invention, there is provided a semiconductor device comprising a semiconductor substrate with a first insulating layer provided on a major surface of a semiconductor substrate, a first extended wiring layer of, for example, polycrystalline silicon, formed on the first insulating layer and preferably having an essentially rectangular cross-sectional shape, a second insulating layer provided on the first insulating layer and on the first wiring layer, a contact hole provided in the second insulating layer to expose a contact region of the first wiring layer and having a width greater than the width of the contact region of the first wiring layer, a third insulating layer formed in the contact hole in contact with the side walls of the contact region of the first wiring layer and having a thickness which decreases in height smoothly and gradually in a direction away from the side walls of the contact region of the first wiring layer, a second extended wiring layer of, for example, aluminum formed on the second insulating layer, in contact with the third insulating layer in the contact hole and connected electrically to the upper surface of the contact region of the first wiring layer.

The width of the first wiring layer in the contact region may be essentially the same as the width of another region of the first wiring layer under the second insulating layer. Also, the width of a portion of the second wiring layer in contact with the first wiring layer may be essentially the same as the width of another portion of the second wiring layer extending along the second insulating layer. Generally, the third insulating layer and the second insulating layer are of the same material, such as silicon oxide deposited by a chemical vapor deposition technique, or phosphosilicate glass, or silica film formed by painting. The height of the third insulating layer at portions where it adheres to the side walls of the contact region of the first wiring layer may be the same as the film thickness of the first wiring layer. More particularly, the height may range from the film thickness of the first wiring layer to a height which is 0.5 $\mu$m less than the film thickness of the first wiring layer. The outer edges of the third insulating layer are favorably positioned at 0.3 $\mu$m to 1.0 $\mu$m from the side wall of the first wiring layer.

According to another aspect of the present invention, there is provided a method of manufacturing a semiconductor device comprising steps of forming the first wiring layer on a first insulating layer provided on a major surface of a semiconductor substrate and having an essentially rectangular cross-sectional shape, forming a second insulating layer of, for example, silica film by painting, or phosphosilicate glass film by a high-temperature treatment, on the first wiring layer and on the first insulating layer, removing a portion of the second insulating layer above a contact region of the first wiring layer by, for example, reactive ion etching to form a contact hole so as to expose the upper surface of the contact region of the first wiring layer and to leave a part of the second insulating layer within the contact hole such that its thickness is decreased smoothly from the side walls of the contact region of the first wiring layer, and forming a second wiring layer on the second insulating layer, on the retained part of the second insulating layer within the contact hole, and on the upper surface of the contact region to form an electrical connection to the first wiring layer. The etching process advantageously is carried out such that the second insulating layer is etched predominately more than the first wiring layer. Alternatively, the etching process is carried out such that the second insulating layer and the first wiring layer are etched concurrently.

In consideration of the function of preventing discontinuities in the second wiring layer effectively and with ease of formation, it is preferable that the insulating layer provided at the sides of the contact region of the first wiring layer within the contact hole has such a cross-sectional shape that the height is equal to a thickness of the contact region of the first wiring layer or is not more than 0.5 $\mu$m less than the thickness at the side walls of the contact region of the first wiring layer, and that the height decreases gradually to zero at a location of 0.3 to 1.0 μm from the side wall of the contact region of the first wiring layer. It is further preferable that the insulating layers according to this invention patternized by plasma etching.

DESCRIPTION OF THE PRIOR ART

Figure 1A:
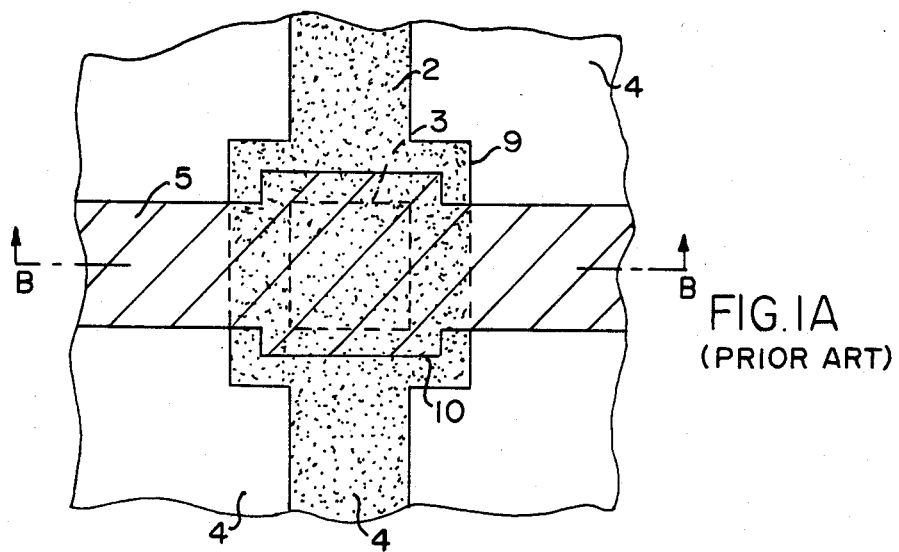
FIG. 1A is a plan view of a first semiconductor device according to the prior art.
Figure 1B:
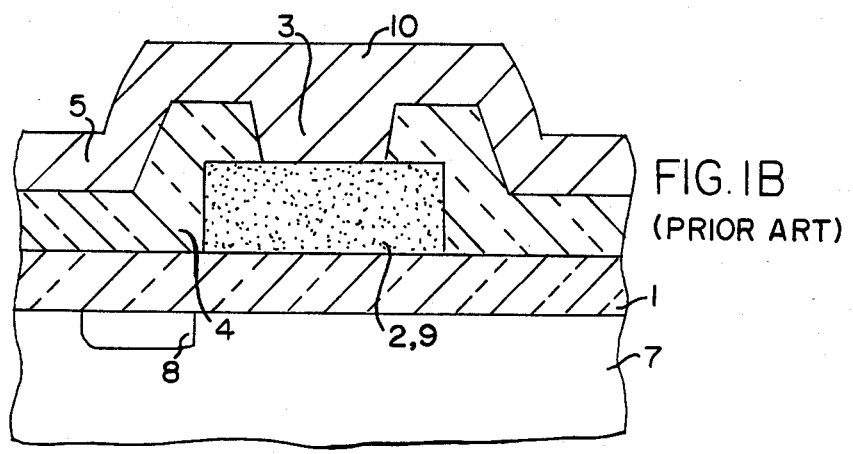
FIG. 1B is a cross-sectional view of the device taken along the line B—B' of FIG. 1A in the direction indicated by arrows.

In the example of a prior art semiconductor device shown in FIGS. 1A and 1B, a first wiring layer 2 which is polycrystalline silicon of 1.0 μm thick and 2.5 μm wide extends over a first insulating layer 1 of silicon oxide which is provided on the major surface of a semiconductor substrate 7 with an element region 8 formed thereon. The first wiring layer 2 has a flat, square contact region 9 which 5.5 μm on a side. A second insulating layer 4 formed by vapor phase growth is provided over the first wiring layer 2 and the first insulating layer 1, and a flat, square contact hole 3 which is 2.5 μm on a side is provided in the second insulating film. A second wiring layer 5 of 1 μm thick aluminum extends over the second insulating layer and has a square contact region 10 which is 4.5 μm on a side connected to the first wiring layer through the contact hole 3. In this structure the contact region of both the first wiring layer and the second wiring layer must be large in area. Therefore, a semiconductor device with a highly integrated wiring structure can not be obtained.

Figure 2:
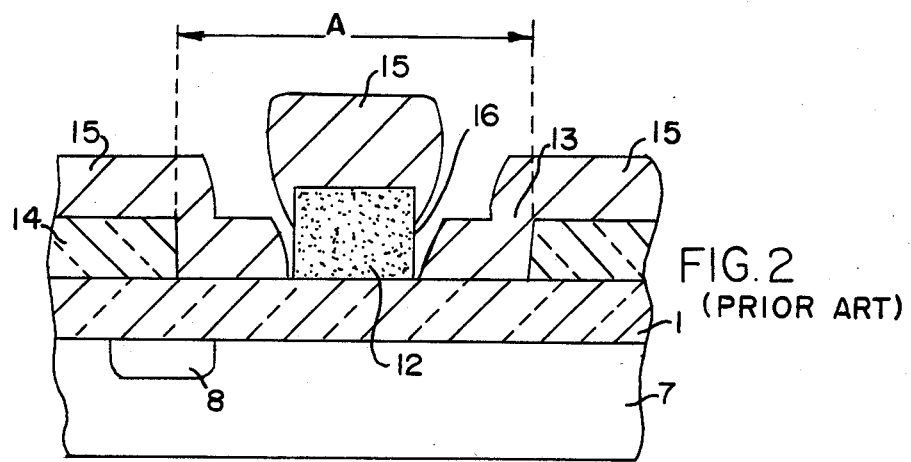
FIG. 2 is a cross-sectional view of another semiconductor device according to the prior art.

Another another example of a semiconductor device according to the prior art, is shown in FIG. 2, in which elements like those of FIG. 1 prior art examples are identified with like numbers. A first wiring layer 12 of polycrystalline silicon having a 1 μm thickness and a 2.5 μm width extends over the first insulating layer 1. The contact region (shown in section in FIG. 2) of the first wiring layer has the same width as that of another region thereof. A contact hole 13 is provided in a second insulating layer 14 formed by vapor phase growth. The position of the contact hole 13 extends for a distance A beyond the first wiring layer 12. In such a structure, since a large contact region like that of the FIG. 1 device is not required for the wiring layer, the integration capability of the FIG. 2 device is improved. However, the first wiring layer 12 has an abrupt step at an edge region 16. Therefore a second wiring layer 15 of aluminum, for example, which extends over the second insulating layer 14 and is connected to the first wiring layer can be discontinuous as illustrated in FIG. 2.

DESCRIPTION OF THE PREFERRED EMBODIMENTS

First Embodiment:

Referring to FIGS. 3A-3C and FIG. 4, a first insulating layer 1 of silicon oxide is formed on the major surface of a semiconductor substrate 7 having an element region 8 formed thereon. A first wiring layer 22, of polycrystalline silicon, for example, which has a 1 μm thickness and an essentially rectangular cross-sectional structure, extends along the first insulating layer 1 in one direction with a uniform width of 2.5 μm. Specifically, a contact region 22' (shown in sections in FIGS. 3A-3C) of the first wiring layer has 2.5 μm width like another region of the first wiring layer. A second insulating layer 24 approximately 1.0 μm in thickness is deposited over the first wiring layer and the first insulating layer. The second insulating layer 24 is a silica film ($SiO_2$) which is formed by a painting method. An examplary painting method comprises the steps of mixing 5 g of silicon-hydroxide ($Si(OH)_4$) powder with 75 g of ethyl alcohol to obtain a solution, coating the solution over the substrate, that is over the first wiring layer and the first insulating layer, and heating the substrate for about one hour at 300° C. to 400° C. in a nitrogen atmosphere to evaporate the ethyl alcohol and water vapor to leave the silicon di-oxide film.

The second insulating layer alternatively is a phosphosilicate glass film which is obtained by vapor phase growth, or a composite film thereof, so as to cover an edge 28 of the first wiring layer 22 thoroughly and smoothly. (See FIG. 3A)

Next, the outside of the second insulating layer 24 is masked over a region B by photoresist (not shown) and is treated by reactive plasma etching so that a contact hole 23 is formed at the region B on the contact region 22' of the first wiring layer 22. The reactive plasma etching is carried out in an atmosphere of $CF_4$ (carbon tetrafluoride) and $H_2$ at approximately $10^{-4}$ atm. for approximately 10 minutes. Under these conditions, the second insulating layer can be etched much faster than the polycrystalline silicon. The upper surface 27 of the contact region 22 is thus exposed and part of the second insulating layer which is smooth and decreases gradually in film thickness remains on both sides of the contact region 22' of the first wiring layer 22 after approximately 10 minutes of such etching, thus forming residual insulating material 24' attached to the side walls of the contact region 22' within the contact hole 23. (See FIG. 3B) In the prior art, even if a hole for any outward-extracted contact structure is formed having the same structural size by reactive plasma etching, the etching is carried out in a atmosphere of $CF_4$ and $H_2$ at $10^{-4}$ atm. for at least 20 minutes, 30 minutes being examplary. As a consequence, the insulating layer on both sides of the first wiring layer within the contact hole is removed completely as shown in FIG. 2.

Figure 3A:
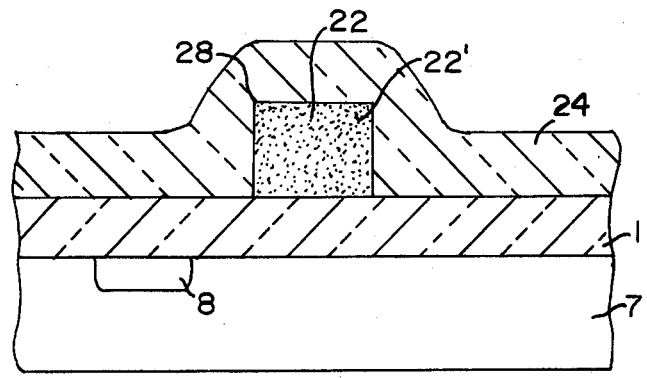
FIGS. 3A to 3C are cross-sectional views showing the manufacture of a first embodiment of the present invention in the order of processing.
Figure 3B:
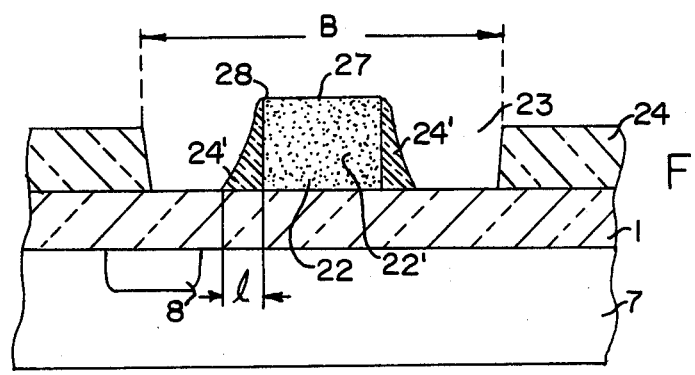
Figure 3C:
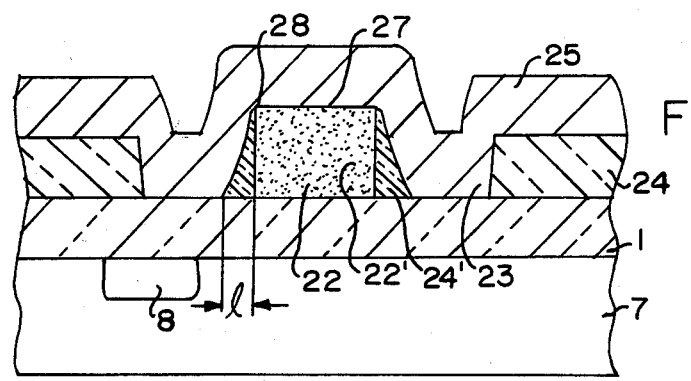

The residual insulating layer 24' within the contact hole 23 which is provided on both sides of the contact region 22' in accordance with the present invention of the first wiring layer 22 preferably has the same height as the first wiring layer contact region 22', as shown in FIGS. 3A-3C, at the side wall thereof. However, satisfactory results are obtained even if the height of the insulating layer residual portion 24' is lower than the thickness of the first wiring layer 22' by as much as 0.5 μm. It is preferable that the length l, as has been denoted for the insulating layer portion 24', over which the height of the portion decreases smoothly and gradually to zero is 0.3 to 1.0 μm.

Figure 4:
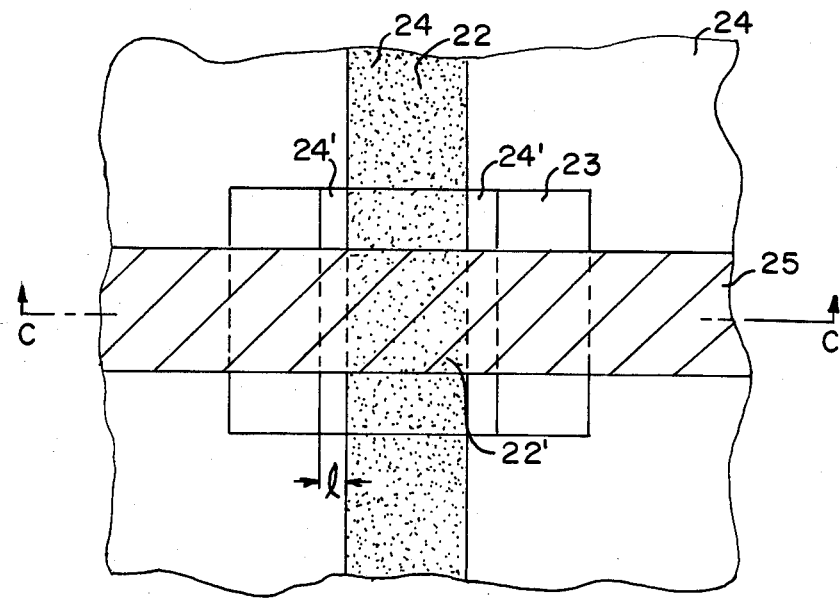
FIG. 4 is a plan view of FIG. 3C.

Next, as shown in FIGS. 3C and 4, a second wiring layer 25, which is uniformly 2.5 μm wide, and which is made, for example, of 1.0 μm thick aluminum extends rectangularly as viewed in plan to connect with the upper surface 27 of the contact region 22' of the first wiring layer 22.

According to the present invention, since an insulating layer 24' decreasing smoothly and gradually in film thickness is provided on the sides of the first wiring layer 22, no discontunity in the second wiring layer 25 occurs in the region of the edges 28 of the first wiring layer 22. Therefore, as shown in the plan view of FIG. 4, the contact hole 23 can extend beyond the first wiring layer 22. Further, the first wiring layer 22 does not need to be enlarged at its contact portion, and therefore the wiring intervals, or wiring density, of the first wiring layer 22 can be improved, for example, by 80%, compared to the same layer of the prior art device shown in FIG. 1.

As suggested in this embodiment, anisotropic reactive ion etching is suitable for opening the contact hole 23, because conventional liquid etching, if applied to the second insulating film, will remove completely all the residual insulating material.

Figure 5:
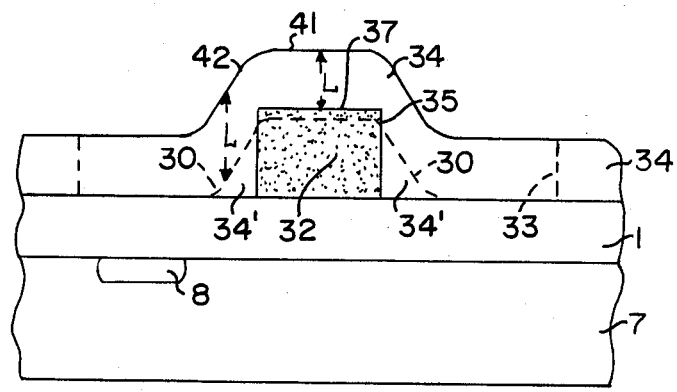
FIG. 5 is a cross-section view of a second embodiment of the present invention.

Second Embodiment:

Referring to FIG. 5, in which elements like those of the FIG. 3 embodiment have been identified with like numerals, in order to provide a contact hole 33 in a second insulating layer 34, an etching process is employed that has a strong anisotropy and allows the operations performed on both the second insulating layer 34 and the first wiring layer 32 to proceed almost simultaneously. In reactive etching, the etching rate of the silicon dioxide constituting the second insulating layer and the etching rate of the polycrystalline silicon constituting the first wiring layer can be kept almost equal by adjusting the ratio of $CF_4$ to $H_2$ in the etching atmosphere and the atmospheric pressure conditions.

In this embodiment, when an upper surface 37 of the first wiring layer 32 is exposed, as shown in FIG. 5, by etching the second insulating layer 34 for the necessary period of time, the second insulating layer 34 and part of the upper surface 37 of the first wiring layer 32 are etched and removed vertically to almost the same thickness. In other words, the etching depth from a horizontal surface 41 of the second insulating layer 34 disposed over the first wiring layer and the vertical etching depth from an inclined surface 42 of the second insulating layer 34 have almost the same value, L. Thus residual insulating material 34' is shaped as shown by the broken line 30, wherein the shape of a connection 35 between the residual insulating material 34' and the first wiring layer 32 has a smoothness which more effectively prevents discontinuities in the second wiring layer.

What is claimed is:

1. A semiconductor device comprising a semiconductor substrate having a major surface, a first insulating layer formed on said major surface, a first extended wiring layer formed on said first insulating layer and having a contact portion having a bottom surface attached to the upper surface of said first insulating layer, said contact portion having a substantially rectangular cross-sectional shape with side walls substantially perpendicular to the upper surface of said first insulating layer and an exposed upper surface extending over the entire width of said first wiring layer, said side walls being coated with a silicon dioxide film, a second insulating layer provided over said first insulating layer and said first wiring layer except at a contact hole area where the entire upper surface of said contact portion and portions of the surface of said first insulating layer on both sides of said contact portion are exposed, said silicon dioxide film being positioned in said contact hole and coating said side walls of said contact portion, said silicon dioxide film having a height substantially equal to the height of said contact portion of said first wiring layer and a thickness gradually tapering from a bottom portion adjacent said first insulating layer to a top portion adjacent said exposed upper surface of said contact portion, said bottom portion of said silicon dioxide film being in contact with the upper surface of said first insulating layer thereby to leave an exposed portion in said first insulating layer at said contact hole, and a second extended wiring layer formed on said second insulating layer and being in contact, in said contact hole, with the exposed portions of the surface of said first insulating layer, the surface of said silicon dioxide film, and the entire upper surface of said contact portion of said first wiring layer.

2. The semiconductor device of claim 1, wherein the width of said contact portion of said first wiring layer is essentially the same as the width of another portion of said first wiring layer under said second insulating layer.

3. The semiconductor device of claim 1, wherein the width of a portion of said second wiring layer in contact with the entire upper surface of said contact portion of said first wiring layer is essentially the same as the width of another portion of said second wiring layer.

4. The semiconductor device of claim 1, wherein the height of said silicon dioxide film at the side wall of said contact portion of said wiring layer is not more than 0.5 $\mu m$ less than the film thickness of said contact portion of said first wiring layer.

5. The semiconductor device of claim 1, wherein the height of said silicon dioxide film is substantially zero at a distance of from 1.09 $\mu m$ to 0.1 $\mu m$ from the side wall of said contact portion of said first wiring layer.

6. The semiconductor device of claim 1, wherein said second insulating layer is formed of silicon dioxide.

7. The semiconductor device as defined in claim 1, wherein said first wiring layer contains polycrystalline silicon, and said second wiring layer contains aluminum.

8. The semiconductor device of claim 1, wherein said second insulating layer is a layer formed by vapor-phase growth.

9. The semiconductor device of claim 8, wherein said second insulating layer is a phosphosilicate glass film.

10. The semiconductor device of claim 1, wherein said second insulating layer is a layer formed by painting.

11. The semiconductor device of claim 10, wherein said second insulating layer is a silica film.

12. The semiconductor device of claim 1, wherein said at least one-third insulating layer is a layer formed from said second insulating layer as a result of formation of said contact hole.

13. The semiconductor device of claim 12 wherein said contact hole is a hole formed by anisotropic reactive ion etching.

14. A semiconductor device comprising a semiconductor substrate having a major surface, a first insulating layer formed on said major surface, a first wiring layer of polycrystalline silicon having a substantially uniform width, a substantially uniform height and a substantially rectangular cross-sectional shape with side walls and an upper surface, said first wiring layer being formed on said first insulating layer and having a contact portion, a second insulating layer provided over said first wiring layer, said second insulating layer having a contact hole to expose completely said contact portion of said first wiring layer, a plurality of third insulating layers of the same material as said second insulating layer formed in said contact hole in contact respectively with corresponding side walls of said contact portion, each of said third insulating layers having a thickness which decreases in height smoothly and gradually in a direction away from said corresponding side wall of said contact portion of said first wiring layer such that the height of the portion of said third insulating layer in contact with said side wall is substantially equal to the height of said contact portion and the height of said third insulating layer is substantially zero at a distance from 1.0 m to 0.3 m from said corresponding side wall of said contact portion within said contact hole, the entire upper surface of said contact portion of said first wiring layer being exposed, and a second wiring layer of metallic material having a substantially uniform width and formed on said second insulating layer, said second wiring layer being in contact, in said contact hole, with a portion of said first insulating layer, with said third insulating layer and with the entire upper surface of said contact portion across the entire width of said first wiring layer.

* * * * *